US012775045B2

(12) United States Patent
Chiu

(10) Patent No.: US 12,775,045 B2
(45) Date of Patent: Oct. 27, 2026

(54) SIGNAL SEPARATION DEVICE AND SIGNAL SEPARATION METHOD

(71) Applicant: NANYA TECHNOLOGY CORPORATION, New Taipei city (TW)

(72) Inventor: Yaochang Chiu, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 0 days.

(21) Appl. No.: 18/747,513

(22) Filed: Jun. 19, 2024

(65) Prior Publication Data

US 2025/0389772 A1 Dec. 25, 2025

(51) Int. Cl.
*G01R 31/319* (2006.01)

(52) U.S. Cl.
CPC . *G01R 31/31922* (2013.01); *G01R 31/31926* (2013.01)

(58) Field of Classification Search
CPC .................... G01R 31/31922; G01R 31/31926
See application file for complete search history.

(56) References Cited

U.S. PATENT DOCUMENTS

2011/0047319 A1* 2/2011 Jeon .................... G06F 13/4243 711/E12.001
2015/0228327 A1 8/2015 Seo et al.

* cited by examiner

*Primary Examiner* — Mark D Featherstone
*Assistant Examiner* — Jack Kensington Barnett
(74) *Attorney, Agent, or Firm* — CKC & Partners Co., LLC

(57) ABSTRACT

The signal separation device includes a memory. The memory includes a test circuit, a first buffer, and a command terminal. The test circuit is configured to output a test signal. The first buffer is configured to output a first delay signal according to the test signal. The command terminal is configured to output a command path signal according to the test signal and the first delay signal. The first buffer is coupled between the test circuit and the command terminal.

13 Claims, 4 Drawing Sheets

300

SIGNAL SEPARATION DEVICE AND SIGNAL SEPARATION METHOD

BACKGROUND

Field of Invention

The present invention relates to a separation device and separation method. More particularly, the present invention relates to a signal separation device and signal separation method.

Description of Related Art

Since the input a data strobe signal (DQS) signal inside DRAM is mostly continuous, and sometimes it is necessary to adjust the DQS signal under certain circumstances, but because the input DQS signal is continuous, there is often a chain effect of pulling.

SUMMARY

The present disclosure provides a signal separation device. The signal separation device includes a memory. The memory includes a test circuit, a first buffer, and a command terminal. The test circuit is configured to output a test signal. The first buffer is configured to output a first delay signal according to the test signal. The command terminal is configured to output a command path signal according to the test signal and the first delay signal. The first buffer is coupled between the test circuit and the command terminal.

The present disclosure provides a signal separation method. The signal separation method includes the following steps: outputting a test signal by a test circuit; outputting a first delay signal by a first buffer according to the test signal; and outputting a command path signal by a command terminal according to the test signal and the first delay signal. The first buffer is coupled between the test circuit and the command terminal.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
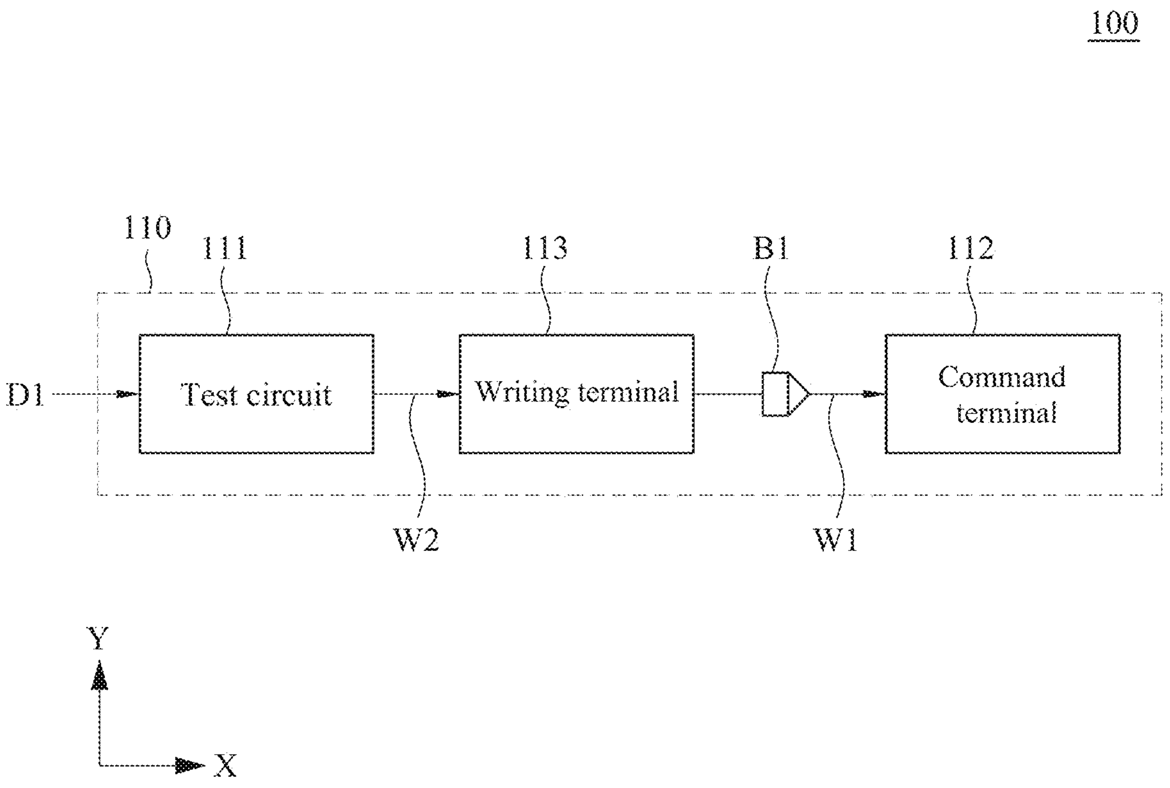
FIG. 1 is a block diagram of a signal separation device according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

The embodiments below are described in detail with the accompanying drawings, but the examples provided are not intended to limit the scope of the disclosure covered by the description. The structure and operation are not intended to limit the execution order. Any structure regrouped by elements, which has an equal effect, is covered by the scope of the present disclosure.

Various embodiments of the present technology are discussed in detail below with figures. It should be understood that the details should not limit the present disclosure. In other words, in some embodiments of the present disclosure, the details are not necessary. In addition, for simplification of figures, some known and commonly used structures and elements are illustrated simply in figures.

In the present disclosure, "connected" or "coupled" may refer to "electrically connected" or "electrically coupled." "Connected" or "coupled" may also refer to operations or actions between two or more elements.

FIG. 1 is a block diagram of a signal separation device according to one embodiment of the present disclosure. As shown in FIG. 1, in some embodiments, the signal separation device 100 includes a memory 110.

For example, the memory 110 can be a dynamic random access memory (DRAM), such as a DDR3 DRAM, a DDR4 DRAM, or a DDR5 DRAM, but the present disclosure is not limited to this embodiment. In some embodiments, the memory 110 can receive a data D1, and a processor (such as a Central Processing Unit (CPU)) can output the data D1.

In the same embodiment, the memory 110 includes a test circuit 111, a first buffer B1, and a command terminal 112. The test circuit 111 is configured to output a test signal.

For example, the test signal can be an internal data strobe signal (DQS) signal or a DQS signal, the test circuit 111 can have a test mode for translating the data D1 to the test signal, but the present disclosure is not limited to this embodiment. In some embodiments, the DQS signal can be a source synchronous timing reference signal.

In the same embodiment, the first buffer B1 is configured to output a first delay signal according to the test signal.

For example, the first buffer B1 can be a buffer or an inverter, the first buffer B1 can change a phase of the test signal by being activated or deactivated. When the first buffer B1 is deactivated, the first buffer B1 shorts the writing terminal 113 to the command terminal 112. When the first buffer B1 is activated, the first buffer B1 delays the test signal to change the phase, but the present disclosure is not limited to this embodiment.

In the same embodiment, the command terminal 112 is configured to output a command path signal according to the test signal and the first delay signal.

For example, the command (CMD) path signal can be a tDQSS signal, and a first system on a chip (SoC) can receive the command path signal, but the present disclosure is not limited to this embodiment. Data is written from the write command at the first rising edge of DQS. This period of time is called tDQSS. A range of tDQSS can be 0.75T to 1.25T. In some embodiment, T is referred to as a time length of one of the N phase periods. Details of the N phase periods are discussed below with the embodiments associated with the FIG. 3.

In the same embodiment, an input terminal of the first buffer B1 is coupled to an output terminal of the test circuit 111 and an output terminal of the first buffer B1 is coupled to the command terminal 112.

For example, the command terminal can have a first wire W1, the first buffer B1 can be located on the first wire W1, but the present disclosure is not limited to this embodiment.

In the same embodiment, the memory 110 further includes a second wire W2 and a writing terminal 113.

For example, the test circuit 111, the second wire W2, the writing terminal 113, the first wire W1, the first buffer B1, and a command terminal 112 can be arranged along a first direction (such as a X axis), but the present disclosure is not limited to this embodiment.

Figure 2:
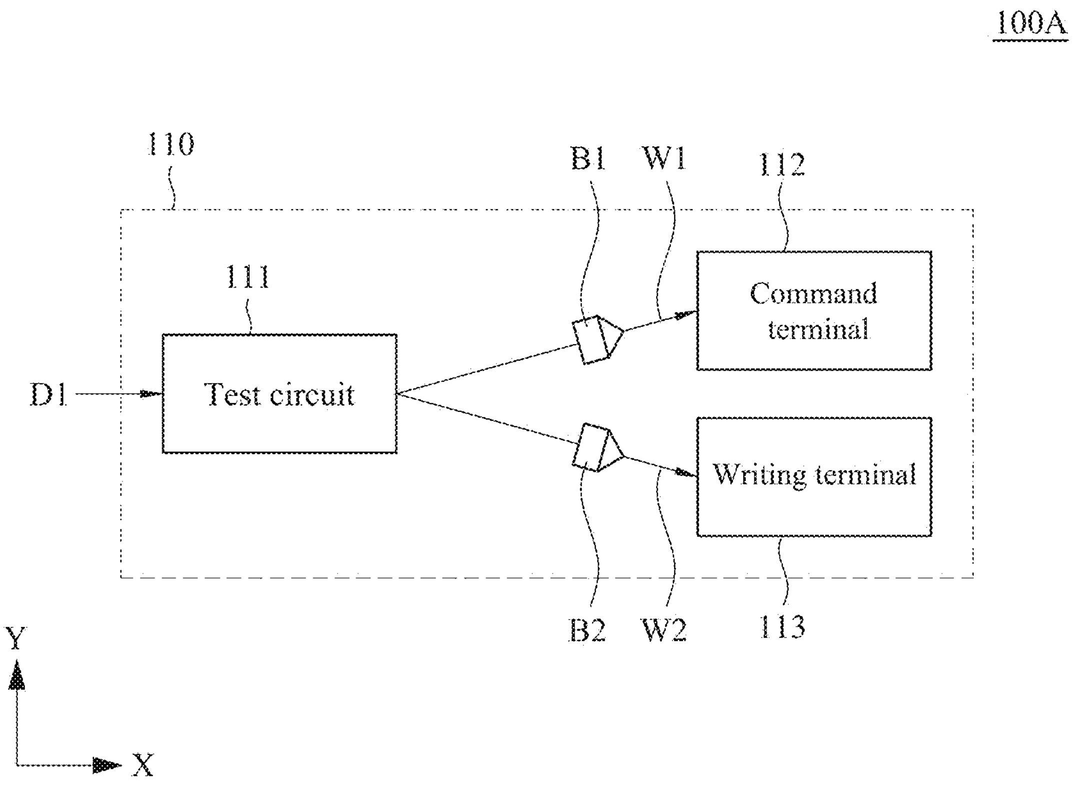
FIG. 2 is a block diagram of a signal separation device according to one embodiment of the present disclosure.

FIG. 2 is a block diagram of a signal separation device according to one embodiment of the present disclosure. As shown in FIG. 2, in some embodiments, the signal separation device 100A includes a memory 110.

For example, the memory 110 can be the dynamic random access memory (DRAM), such as the DDR3 DRAM, the DDR4 DRAM, or the DDR5 DRAM, but the present disclosure is not limited to this embodiment. In some embodiments, the memory 110 can receive the data D1, and the processor (such as the Central Processing Unit (CPU)) can output the data D1.

In the same embodiment, the memory 110 includes the test circuit 111, the first buffer B1, and the command terminal 112. The test circuit 111 is configured to output the test signal.

For example, the test signal can be an internal DQS signal or the DQS signal, the test circuit 111 can have the test mode for translating the data D1 to the test signal, but the present disclosure is not limited to this embodiment.

In the same embodiment, the first buffer B1 is configured to output the first delay signal according to the test signal.

For example, the first buffer B1 can be the buffer or the inverter, the first buffer B1 can change the phase of the test signal by short itself or not, but the present disclosure is not limited to this embodiment.

In the same embodiment, the command terminal 112 is configured to output the command path signal according to the test signal and the first delay signal.

For example, the command (CMD) path signal can be the tDQSS signal, and the first system on the chip (SoC) can receive the command path signal, but the present disclosure is not limited to this embodiment.

In some embodiments, the first buffer B1 is coupled between the test circuit 111 and the command terminal 112.

For example, the command terminal 112 can have the first wire W1, the first buffer B1 can be located on the first wire W1, but the present disclosure is not limited to this embodiment.

In some embodiments, the memory 110 further comprises a second buffer B2 and the writing terminal 113.

For example, the writing terminal 113 and the command terminal 112 can be arranged along a second direction (such as a Y axis), but the present disclosure is not limited to this embodiment. In some embodiments, the first direction and the second direction are perpendicular with each other.

In some embodiments, the second buffer is configured to output a second delay signal according to the test signal.

For example, the second buffer B2 can be the buffer or the inverter, and the second buffer B2 can change the phase of the test signal by being activated or deactivated. When the second buffer B2 is deactivated, the buffer B1 shorts the writing terminal 113 to the command terminal 112. When the second buffer B2 is activated, the second buffer B2 delays the test signal to change the phase, but the present disclosure is not limited to this embodiment.

In some embodiments, the writing terminal 113 is configured to output a writing leveling signal according to the test signal and the first delay signal.

For example, a second system on the chip (SoC) can receive the writing leveling signal, but the present disclosure is not limited to this embodiment.

In some embodiments, an input terminal of the second buffer B2 is coupled to an output terminal of the the test circuit 111 and an output terminal of the second buffer B2 is coupled to the writing terminal 113.

For example, the writing terminal 113 can have the second wire W2, the second buffer B2 can be located on the second wire W2, but the present disclosure is not limited to this embodiment.

In some embodiments, the memory 110 further comprises the first wire W1 and the second wire W2. The first wire W1 is coupled between the test circuit 111 and the command terminal 110. The second wire W2 coupled between the test circuit 111 and the writing terminal 113.

In some embodiments, the first buffer B1 is located on the first wire W1. The second buffer B2 is located on the second wire W2.

In some embodiments, the command terminal 112 in FIG. 1 or FIG. 2 outputs the command path signal, and the command path signal can correspond to a signal S1 in FIG. 3 below. The writing terminal 113 in FIG. 1 or FIG. 2 outputs the writing leveling signal, and the writing leveling signal can correspond to a signal S2 in FIG. 3 below.

In some embodiments, the command terminal 112 in FIG. 1 or FIG. 2 outputs the command path signal, and the command path signal can correspond to the signal S2 in FIG. 3 below. The writing terminal 113 in FIG. 1 or FIG. 2 outputs the writing leveling signal, and the writing leveling signal can correspond to the signal S1 in FIG. 3 below.

In some embodiments, when resources are limited and the writing leveling signal and the command path signal need to be separated, the gate delay before the command terminal 112 (or the command path signal) can be deliberately increased. (But it is necessary to confirm the relationship between the delay time of the two and the system platform, and ensure that it can meet the definition of specification).

Figure 3:
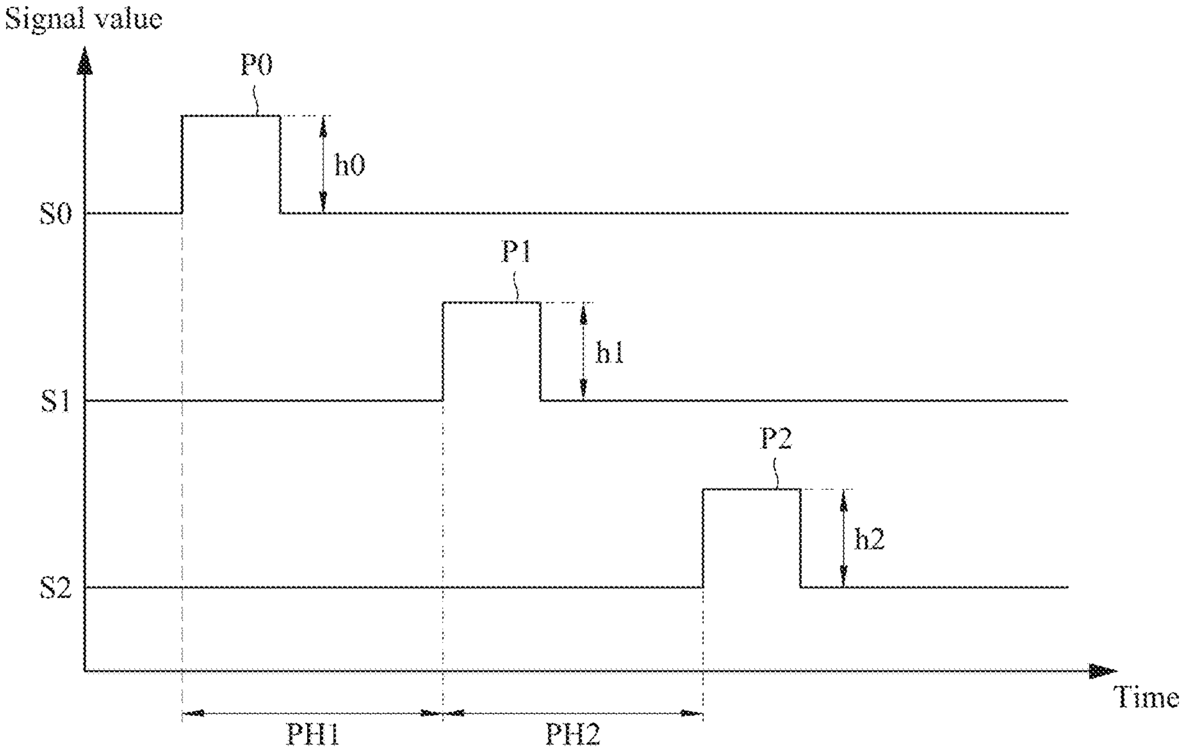
FIG. 3 is a signal timing diagram of a plurality of data of a signal separation device according to one embodiment of the present disclosure.

FIG. 3 is a signal timing diagram of a plurality of data of a signal separation device according to one embodiment of the present disclosure. As shown in FIG. 3, in some embodiments, the signal timing diagram 300 includes a plurality of signals S0 to S2.

For example, a signal S0 can correspond to the DQS signal of the test circuit 111 in FIG. 1 or FIG. 2, the signal S1 can correspond to the writing leveling signal of the writing terminal 113 in FIG. 1 or FIG. 2, the signal S2 can correspond to the command path signal of the command terminal 112 in FIG. 1 or FIG. 2, but the present disclosure is not limited to this embodiment.

In some embodiments, the writing leveling signal S1 includes a first pulse signal P1, and the first pulse signal P1 has a first pulse high value h1. The command path signal S2 includes a second pulse signal P2, and the second pulse signal P2 has a second pulse high value h2.

In some embodiments, the first pulse high value h1 is equal to the second pulse high value h2. In some embodiments, the first pulse high value h1 is not equal to the second pulse high value h2.

In some embodiments, a difference between the first pulse signal P1 and the second pulse signal P2 is N phase periods. N is a positive integer greater than 0.

For example, N phase periods can include at least one of a first period PH1 and a second period PH2, the difference between the first pulse signal P1 and the second pulse signal P2 can be the second period PH2, but the present disclosure is not limited to this embodiment.

In some embodiments, the N phase periods are related to the first delay signal or/and the second delay signal.

For example, the first delay signal can have a first delay time, the second delay signal can have a second delay time, and the N phase periods can be a sum of the first delay time and the second delay time, but the present disclosure is not limited to this embodiment.

In some embodiments, the DQS signal S0 includes a start pulse signal P0, and the start pulse signal P0 has a start pulse high value h0.

In some embodiments, the start pulse high value h0 is equal to the first pulse high value h1 and/or the second pulse high value h2. In some embodiments, the start pulse high value h0 is not equal to the first pulse high value h1 and/or the second pulse high value h2.

In some embodiments, a difference between the start pulse signal P0 and the first pulse signal P1 can be the first period PH1. In some embodiments, the first period PH1 can be equal to the second period PH2. In some embodiments, the first period PH1 can be not equal to the second period PH2.

In some embodiments, the first period PH1 can be 0.25T, and the second period PH2 can be 0.25T.

Figure 4:
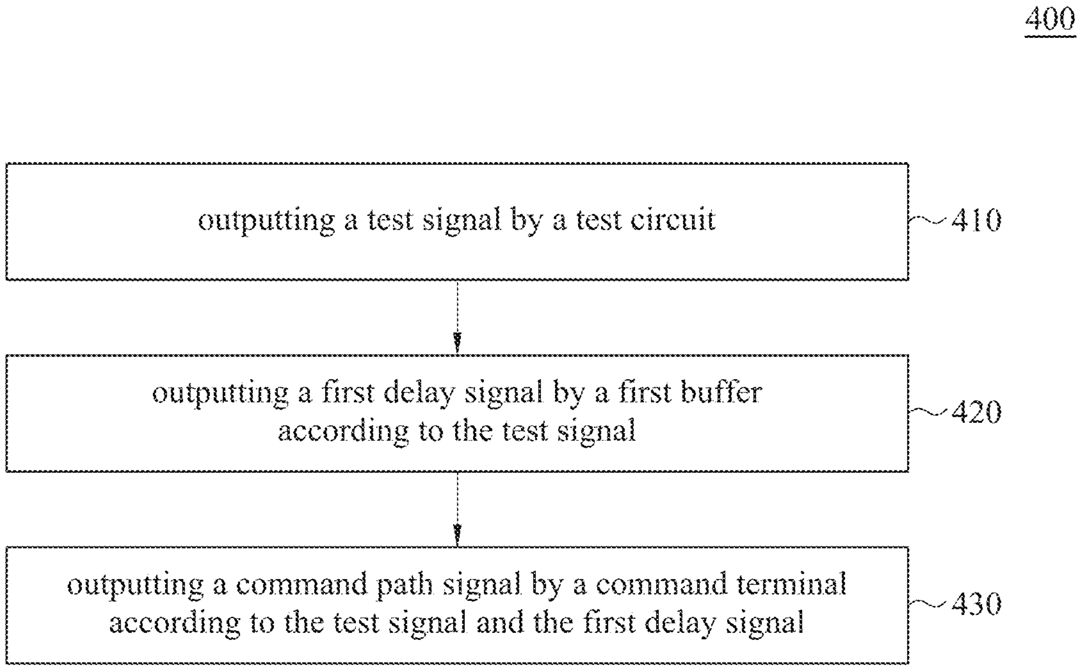
FIG. 4 is a flow chart of steps of a signal separation method according to one embodiment of the present disclosure.

FIG. 4 is a flow chart of steps of a signal separation method according to one embodiment of the present disclosure. As shown in FIG. 4, in some embodiments, the signal separation method 400 includes a plurality of steps 410 to 430.

In step 410, outputting a test signal by a test circuit.

Please refer to FIGS. 1 to 4, in some embodiments, the test circuit 111 outputs a test signal. For example, the operations of the signal separation method 400 are similar to the operations of the signal separation device 100 of FIG. 1, and the descriptions regarding the other operations of the signal separation method 400 will be omitted herein for the sake of brevity.

In step 420, outputting a first delay signal by a first buffer according to the test signal.

Please refer to FIGS. 1 to 4, in some embodiments, the first buffer B1 outputs the first delay signal according to the test signal. For example, the operations of the signal separation method 400 are similar to the operations of the signal separation device 100 of FIG. 1, and the descriptions regarding the other operations of the signal separation method 400 will be omitted herein for the sake of brevity.

In step 430, outputting a command path signal by a command terminal according to the test signal and the first delay signal.

Please refer to FIGS. 1 to 4, in some embodiments, the command terminal 112 outputs the command path signal according to the test signal and the first delay signal. For example, the operations of the signal separation method 400 are similar to the operations of the signal separation device 100 of FIG. 1, and the descriptions regarding the other operations of the signal separation method 400 will be omitted herein for the sake of brevity.

In some embodiments, the first buffer B1 is coupled between the test circuit 111 and the command terminal 112. For example, the operations of the signal separation method 400 are similar to the operations of the signal separation device 100 of FIG. 1, and the descriptions regarding the other operations of the signal separation method 400 will be omitted herein for the sake of brevity.

In some embodiments, the memory 110 comprises the test circuit 111, the first buffer B1, the command terminal 112, a second buffer B2, and a writing terminal 113. For example, the operations of the signal separation method 400 are similar to the operations of the signal separation device 100 of FIG. 1, and the descriptions regarding the other operations of the signal separation method 400 will be omitted herein for the sake of brevity.

In some embodiments, the signal separation method 400 further comprises the following steps: outputting a second delay signal by the second buffer B2 according to the test signal. For example, the operations of the signal separation method 400 are similar to the operations of the signal separation device 100 of FIG. 1, and the descriptions regarding the other operations of the signal separation method 400 will be omitted herein for the sake of brevity.

In some embodiments, the signal separation method 400 further comprises the following steps: outputting a writing leveling signal by the writing terminal according to the test signal and the first delay signal. For example, the operations of the signal separation method 400 are similar to the operations of the signal separation device 100 of FIG. 1, and the descriptions regarding the other operations of the signal separation method 400 will be omitted herein for the sake of brevity.

In some embodiments, the second buffer B2 is coupled between the test circuit 111 and the writing terminal 113. For example, the operations of the signal separation method 400 are similar to the operations of the signal separation device 100 of FIG. 1, and the descriptions regarding the other operations of the signal separation method 400 will be omitted herein for the sake of brevity.

In some embodiments, the writing leveling signal S1 comprises the first pulse signal P1, and the first pulse signal P1 has a first pulse high value h1. The command path signal S2 comprises the second pulse signal P2, and the second pulse signal P2 has a second pulse high value h2. The first pulse high value h1 is equal to the second pulse high value h2.

For example, the operations of the signal separation method 400 are similar to the operations of the signal separation device 100 of FIG. 1, and the descriptions regarding the other operations of the signal separation method 400 will be omitted herein for the sake of brevity.

In some embodiments, the difference between the first pulse signal P1 and the second pulse signal P2 is N phase periods. N is a positive integer greater than 0. For example, the operations of the signal separation method 400 are similar to the operations of the signal separation device 100 of FIG. 1, and the descriptions regarding the other operations of the signal separation method 400 will be omitted herein for the sake of brevity.

In some embodiments, the N phase periods are related to the first delay signal or/and the second delay signal. For example, the operations of the signal separation method 400 are similar to the operations of the signal separation device 100 of FIG. 1, and the descriptions regarding the other operations of the signal separation method 400 will be omitted herein for the sake of brevity.

In some embodiments, the memory 110 further comprises the first wire W1 and the second wire W2. The first wire W1 is coupled between the test circuit 111 and the command terminal 112. The second wire W2 is coupled between the test circuit 111 and the writing terminal 113. For example, the operations of the signal separation method 400 are similar to the operations of the signal separation device 100 of FIG. 1, and the descriptions regarding the other operations of the signal separation method 400 will be omitted herein for the sake of brevity.

In some embodiments, the first buffer B1 is located on the first wire W1. The second buffer B2 is located on the second wire W2. For example, the operations of the signal separation method 400 are similar to the operations of the signal separation device 100 of FIG. 1, and the descriptions regarding the other operations of the signal separation method 400 will be omitted herein for the sake of brevity.

It can be seen from the above embodiments of the present disclosure that the application of the present disclosure has the following advantages. The signal separation device and signal separation method shown in the embodiment of the present disclosure can separate DQS signal, so as to achieve the writing leveling signal and the tDQSS signal fitting the specification of DRAM.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A signal separation device, comprising:

a memory, comprising:

a test circuit, configured to translate data to a data strobe signal;

a first buffer, coupled to the test circuit and configured to receive the data strobe signal and output a first delay data strobe signal according to the data strobe signal;

a second buffer, coupled to the test circuit and configured to receive the data strobe signal and output a second delay data strobe signal according to the data strobe signal;

a command terminal, configured to receive the first delay data strobe signal and output a command path signal according to the first delay data strobe signal; and a writing terminal, configured to receive the second delay data strobe signal and output a writing leveling signal according to the second delay data strobe signal;

wherein the first buffer is coupled between the test circuit and the command terminal;

wherein the writing leveling signal comprises a first pulse signal, and the first pulse signal has a first pulse high value;

wherein the command path signal comprises a second pulse signal, and the second pulse signal has a second pulse high value;

wherein the first pulse high value is equal to the second pulse high value.

2. The signal separation device of claim 1, wherein the second buffer is coupled between the test circuit and the writing terminal.

3. The signal separation device of claim 2, wherein a difference between the first pulse signal and the second pulse signal is N phase periods;

wherein N is a positive integer greater than 0.

4. The signal separation device of claim 3, wherein the N phase periods are related to the first delay data strobe signal or/and the second delay data strobe signal.

5. The signal separation device of claim 1, wherein the memory further comprises a first wire and a second wire;

wherein the first wire is coupled between the test circuit and the command terminal;

wherein the second wire coupled between the test circuit and the writing terminal.

6. The signal separation device of claim 5, wherein the first buffer is located on the first wire;

wherein the second buffer is located on the second wire.

7. A signal separation method, comprising:

translating data to a data strobe signal by a test circuit;

receiving the data strobe signal by a first buffer;

outputting a first delay data strobe signal by the first buffer according to the data strobe signal;

receiving the data strobe signal by a second buffer;

outputting a second delay data strobe signal by the second buffer according to the data strobe signal;

wherein input terminals of the first and second buffers are coupled together at an output terminal of the test circuit;

receiving the first delay data strobe signal by a command terminal;

outputting a command path signal by the command terminal according to the first delay data strobe signal;

wherein the first buffer is coupled between the test circuit and the command terminal;

receiving the second delay data strobe signal by a writing terminal; and outputting a writing leveling signal by the writing terminal according to the second delay data strobe signal;

wherein a pulse in the writing leveling signal is ahead of a pulse in the command path signal.

8. The signal separation method of claim 7, wherein the second buffer is coupled between the test circuit and the writing terminal.

9. The signal separation method of claim 8, wherein the writing leveling signal comprises a first pulse signal, and the first pulse signal has a first pulse high value;

wherein the command path signal comprises a second pulse signal, and the second pulse signal has a second pulse high value;

wherein the first pulse high value is equal to the second pulse high value.

10. The signal separation method of claim 9, wherein a difference between the first pulse signal and the second pulse signal is N phase periods;

wherein N is a positive integer greater than 0.

11. The signal separation method of claim 10, wherein the N phase periods are related to the first delay data strobe signal or/and the second delay data strobe signal.

12. The signal separation method of claim 7, wherein a memory comprises the test circuit, the first buffer, the second buffer, the command terminal, the writing terminal, a first wire, and a second wire;

wherein the first wire is coupled between the test circuit and the command terminal;

wherein the second wire coupled between the test circuit and the writing terminal.

13. The signal separation method of claim 12, wherein the first buffer is located on the first wire;

wherein the second buffer is located on the second wire.

* * * * *